United States Patent
Tsuda (10) Patent No.: US 8,723,523 B2
(45) Date of Patent: May 13, 2014

(54) MAGNETIC RESONANCE IMAGING APPARATUS WITH TEMPERATURE SENSOR FOR PREDICTING STATIC MAGNETIC FIELD INHOMOGENEITY

(75) Inventor: Munetaka Tsuda, Tokyo (JP)

(73) Assignee: Hitachi Medical Corporation, Tokyo (JP)

( * ) Notice: Subject to any disclaimer, the term of this patent is extended or adjusted under 35 U.S.C. 154(b) by 486 days.

(21) Appl. No.: 12/988,406

(22) PCT Filed: Apr. 17, 2009

(86) PCT No.: PCT/JP2009/057718
§ 371 (c)(1),
(2), (4) Date: Oct. 18, 2010

(87) PCT Pub. No.: WO2009/131060
PCT Pub. Date: Oct. 29, 2009

(65) Prior Publication Data
US 2011/0037467 A1 Feb. 17, 2011

(30) Foreign Application Priority Data
Apr. 24, 2008 (JP) .................................. 2008-113819

(51) Int. Cl.
G01R 33/3815 (2006.01)
G01R 33/389 (2006.01)
G01R 33/3873 (2006.01)
G01R 33/421 (2006.01)

(52) U.S. Cl.
USPC ............ 324/320; 324/309; 324/315; 324/318

(58) Field of Classification Search
USPC .......................... 324/300–322; 600/407–435; 382/128–132
See application file for complete search history.

(56) References Cited

U.S. PATENT DOCUMENTS 3,462,677 A * 8/1969 Paitich .......................... 324/321
6,556,012 B2 * 4/2003 Yamashita .................... 324/318
(Continued)

FOREIGN PATENT DOCUMENTS

| JP | 10-71132 | 3/1998 |
| JP | 2004-351207 | 12/2004 |
| JP | 2007-38017 | 2/2007 |
| WO | WO2007/046011 | 4/2007 |

OTHER PUBLICATIONS

International Search Report in PCT/JP2009/057718.

Primary Examiner — Melissa Koval
Assistant Examiner — Tiffany Fetzner
(74) Attorney, Agent, or Firm — Cooper & Dunham LLP (57) ABSTRACT

A magnetic resonance imaging apparatus includes: a pair of static magnetic field generators separately disposed at the top and bottom of an imaging space in which a subject is placed; a shim magnetic material, disposed on the imaging-space side of each of the pair of static magnetic field generators, for generating a magnetic field to adjust the static magnetic field; a gradient magnetic field generator; a high-frequency magnetic field generator; a temperature sensor for directly or indirectly measuring the temperature of the shim magnetic material; and a controller for controlling the gradient magnetic field generator and the high-frequency magnetic field generator to execute an imaging pulse sequence. The controller determines the inhomogeneity of the static magnetic field from the output of the temperature sensor, considering the change in a magnetic field adjustment parameter due to the temperature change of the shim magnetic material, and causes a warning message to be presented if the determined static magnetic field inhomogeneity has exceeded a predetermined allowable value.

12 Claims, 10 Drawing Sheets

(56) References Cited

U.S. PATENT DOCUMENTS

| | | | |
|---|---|---|---|
| 6,567,685 B2* | 5/2003 | Takamori et al. | 600/410 |
| 6,731,113 B2* | 5/2004 | Ham et al. | 324/313 |
| 6,788,060 B1 | 9/2004 | Feenan et al. | |
| 6,825,663 B2* | 11/2004 | Bechtold et al. | 324/318 |
| 6,825,667 B1* | 11/2004 | Tsuda | 324/320 |
| 6,954,068 B1* | 10/2005 | Takamori et al. | 324/318 |
| 7,071,693 B2* | 7/2006 | Yasuhara | 324/319 |
| 7,602,185 B2* | 10/2009 | Nozaki | 324/315 |
| 8,076,450 B2* | 12/2011 | Simon et al. | 530/300 |
| 8,188,741 B2* | 5/2012 | Sakakura | 324/318 |
| 8,305,079 B2* | 11/2012 | Iwasa et al. | 324/315 |
| 2001/0010464 A1* | 8/2001 | Takamori et al. | 324/304 |
| 2001/0022515 A1* | 9/2001 | Yamashita et al. | 324/300 |
| 2003/0107376 A1* | 6/2003 | Yasuhara | 324/318 |
| 2003/0164702 A1* | 9/2003 | Bechtold et al. | 324/315 |
| 2003/0218460 A1* | 11/2003 | Heid | 324/318 |
| 2008/0084262 A1* | 4/2008 | Beasley | 335/216 |
| 2008/0228064 A1 | 9/2008 | Krueger et al. | |
| 2009/0015258 A1* | 1/2009 | Nozaki | 324/315 |
| 2009/0237076 A1* | 9/2009 | Ham | 324/307 |
| 2010/0085053 A1* | 4/2010 | Iwasa et al. | 324/318 |
| 2010/0315086 A1* | 12/2010 | Sakakura | 324/318 |
| 2011/0037467 A1* | 2/2011 | Tsuda | 324/309 |

* cited by examiner

MAGNETIC RESONANCE IMAGING APPARATUS WITH TEMPERATURE SENSOR FOR PREDICTING STATIC MAGNETIC FIELD INHOMOGENEITY

TECHNICAL FIELD

The present invention relates to a magnetic resonance imaging apparatus (hereinafter referred to as MRI apparatus) and, more particularly, to a MRI apparatus that maintains static magnetic field homogeneity and provides high picture quality even when imaging is performed continuously.

BACKGROUND ART

An MRI apparatus applies to a subject placed in a static magnetic field space a high-frequency magnetic field to cause nuclear magnetic resonance (hereinafter referred to as NMR), obtains a generated NMR signal, and performs image reconstruction, thereby providing a subject image. In order to append location information to the NMR signal, a gradient magnetic field that causes an intensity gradient in three axis directions perpendicular to one another is superimposed on the static magnetic field.

For the improvement of imaging processing capability, development of a new imaging function and other purposes, a need for a higher intensity and faster switching speed of the gradient magnetic field exists. However, one problem is that, when a large current is applied to a gradient magnetic field coil, the coil generates heat. For example, Patent Document 1 discloses an MRI apparatus in which, in order to prevent a resin sealing a gradient magnetic field coil from being damaged by the heat generated from the coil, the temperature of the coil is measured and, when the temperature reaches a predetermined temperature lower than the heatproof temperature of the sealing resin, imaging will be inhibited. Patent Document 2 discloses an MRI apparatus in which, in order to prevent the temperature of the gradient magnetic field coil from reaching a predetermined temperature, while imaging, at which imaging may not be continued, the temperature increase during imaging is predicted.

On the other hand, Patent Document 3 discloses a method for solving a problem of an iron york included in a static magnetic field generating magnet being deformed by thermal expansion to cause the static magnetic field homogeneity to change, by measuring the temperature of the magnet to control current to be supplied to the shim coil.

PRIOR ART DOCUMENT

Patent Document

Patent Document 1: JP-A-3-261455
Patent Document 2: JP-A-6-292662
Patent Document 3: JP-A-2000-342554

SUMMARY OF THE INVENTION

Problems to be Solved by the Invention

In recent years, a need for increasing static magnetic field homogeneity more than ever in order to reduce the distortion of MRI images and obtain MRI images in which fat tissue and water tissue are accurately separated. In general, a shim iron piece or shim coil is used to increase static magnetic field homogeneity. However, the inventors proved that, when the shim iron piece is used, the radiation heat due to heat generated from a gradient magnetic field coil and the current induced by the switching of a gradient magnetic field cause the temperature of the shim iron piece to increase, thereby changing the shim amount. So, it is difficult to increase static magnetic field homogeneity more than ever while increasing the intensity and switching speed of the gradient magnetic field.

The change in the shim amount due to the temperature increase of the shim iron piece occurs at a temperature lower than that in which a sealing resin of the gradient magnetic field coil will be damaged. Thus, the conventional methods as described in Patent Documents 1 and 2 cannot solve the problem. Also, the method as described in Patent Document 3 uses shim current to compensate the change in the static magnetic field of a static magnetic field generating magnet itself due to the thermal expansion of an iron yoke, but cannot keep track of the shim amount change of the shim iron piece.

Particularly, one open-type superconducting magnet in which two magnet parts are disposed opposite at the top and bottom sides of the imaging space has a gradient magnetic field coil contained in the concave space of each magnet part of the superconducting magnet in order to widen the imaging space while improving the sound insulation. In this structure, the gradient magnetic field coil is sealed in the concave space, so the shim iron piece is easily heated by the radiation heat from the gradient magnetic field coil.

It is an object of the present invention to provide an MRI apparatus that can keep track of the shim amount change due to the temperature change of a shim iron piece and perform imaging with a high static magnetic field homogeneity maintained.

Means for Solving the Problems

In order to achieve the above object, the invention provides an MRI apparatus as follows. The MRI apparatus includes: a pair of static magnetic field generators separately disposed at the top and bottom of an imaging space in which a subject is placed; a shim magnetic material, disposed on the imaging-space side of each of the pair of static magnetic field generators, for generating a magnetic field to adjust the static magnetic field homogeneity of the static magnetic field generators; a gradient magnetic field generator; a high-frequency magnetic field generator; a temperature sensor for directly or indirectly measuring the temperature of the shim magnetic material; and a controller for controlling the gradient magnetic field generator and the high-frequency magnetic field generator to execute an imaging pulse sequence. The controller determines the static magnetic field inhomogeneity from the output of the temperature sensor, considering the change in a magnetic field adjustment parameter due to the temperature change of the shim magnetic material, and causes a warning message to be presented if the determined static magnetic field inhomogeneity has exceeded a predetermined allowable value. Thus, directly or indirectly measuring the temperature of the shim magnetic material allows the change in the shim amount due to temperature change of the shim magnetic material to be kept track of, in turn allowing the change in the static magnetic field inhomogeneity to be determined. This allows a warning message to be presented when a predetermined allowable value has been exceeded. So, imaging can be performed with a high static magnetic field homogeneity maintained.

For example, the controller predicts from the temperature measured by the temperature sensor the temperature while imaging when the imaging pulse sequence is executed, and predicts using the predicted temperature the static magnetic field inhomogeneity while imaging.

Thus, the controller can predict the static magnetic field homogeneity while imaging to cause the warning message to be presented in advance. So, the possibility can be excluded that, while imaging, the temperature increases and the static magnetic field homogeneity in turn deteriorates, and then an accurate image cannot be obtained and imaging ends in vain.

The controller can also determine the static magnetic field inhomogeneity at the point when the temperature sensor measures the temperature.

With a shim coil for generating a magnetic field to adjust the static magnetic field further included, if the static magnetic field inhomogeneity has exceeded a predetermined allowable value, the controller can determine whether or not the static magnetic field inhomogeneity can be compensated by supplying a shim current to the shim coil, and if the static magnetic field inhomogeneity is not within a compensable range, the controller can cause the warning message to be presented. Thus, the static magnetic field inhomogeneity can be compensated by the shim current, imaging can be continued.

The controller can also be configured to receive an instruction to perform or suspend imaging from the operator after causing the warning message to be presented. This is because the decrease in the static magnetic field homogeneity does not damage the devices themselves including the gradient magnetic field coil, and, for example, if imaging dose not require a high static magnetic field homogeneity, the operator may allow imaging to be continued.

The controller can also be configured to receive an imaging parameter change of the imaging pulse sequence from the operator after causing the warning message to be presented. This is because changing the imaging parameter may allow the temperature increase while imaging to be suppressed. The controller can also be configured to wait a predetermined time and cause the shim magnetic material to be cooled when the controller has received the instruction to suspend imaging from the operator.

Also, in order to predict the static magnetic field inhomogeneity while imaging, the controller, for example, can predict the temperature while imaging from the increase (determined in advance) in the temperature measured by the temperature sensor when the imaging pulse sequence is executed, and can use the relation (determined in advance) between the temperature measured by the temperature sensor and the static magnetic field inhomogeneity to determine the static magnetic field inhomogeneity while imaging corresponding to the predicted temperature measured by the temperature sensor.

Also, in order to determine the static magnetic field homogeneity at the point when the temperature sensor measures the temperature, the controller, for example, can use the relation (determined in advance) between the temperature measured by the temperature sensor and the static magnetic field inhomogeneity to determine the static magnetic field inhomogeneity corresponding to the temperature measured by the temperature sensor.

The temperature sensor can measure the temperature of the gradient magnetic field generator to indirectly measure the temperature of the shim magnetic material.

Advantage of the Invention

According to the invention, an open-type MRI apparatus can be provided that can keep track of the shim amount change due to the temperature change of a shim iron piece and can perform imaging with a high static magnetic field homogeneity maintained. This can always provide an image with a constant quality.

DESCRIPTION OF REFERENCE NUMERALS AND SIGNS 101 superconducting magnet, 101a top cryostat (magnetomotive force source), 101b bottom cryostat (magnetomotive force source), 102 subject, 103 imaging space, 104 shim plate, 105 gradient magnetic field coil, 106 high-frequency coil, 107 detecting coil, 110 magnet control unit, 111 filter circuit, 113 computer, 114 display, 210 concave, 212 shim bolts, 215 thermocouple sensor, 301 gradient magnetic field power supply, 304 shim power supply, 305 shim coil Mode for Carrying Out the Invention One embodiment of the invention is described with reference to the drawings.

First Embodiment

Figure 1:
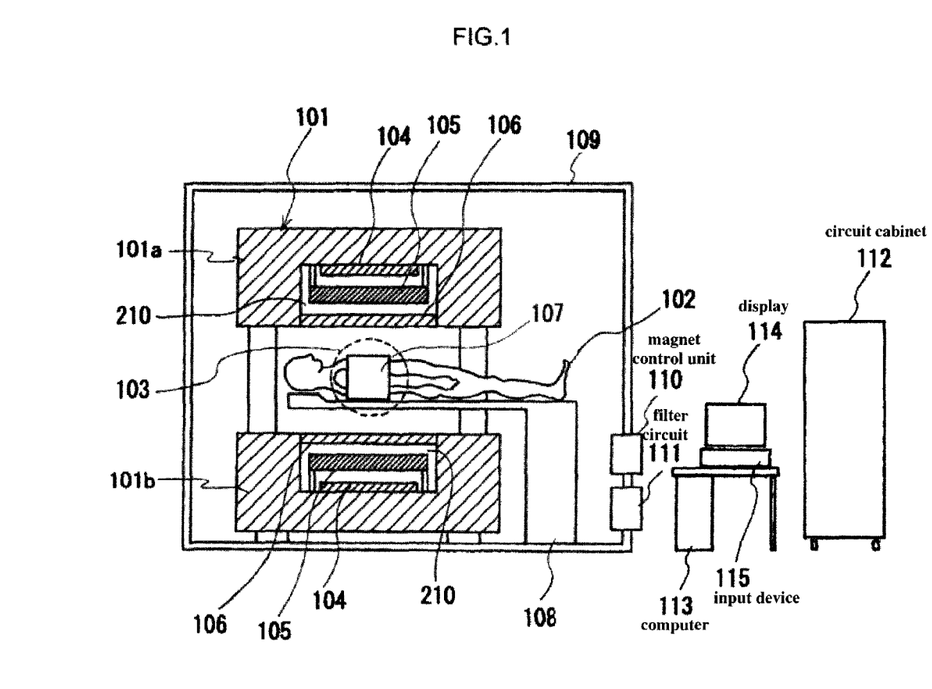
[FIG. 1] An illustration showing an entire configuration of an open-type MRI apparatus in accordance with a first embodiment of the invention.
Figure 2:
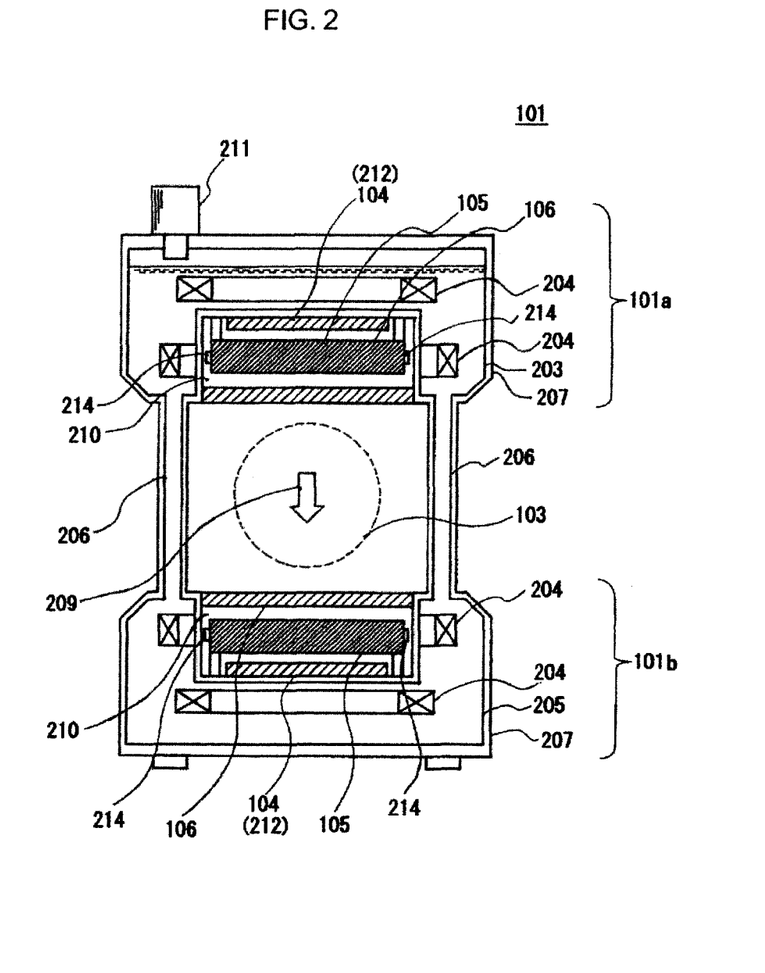
[FIG. 2] A cross-sectional view of a superconducting magnet, a gradient magnetic field coil and a shim plate of the MRI apparatus of FIG. 1.
Figure 3:
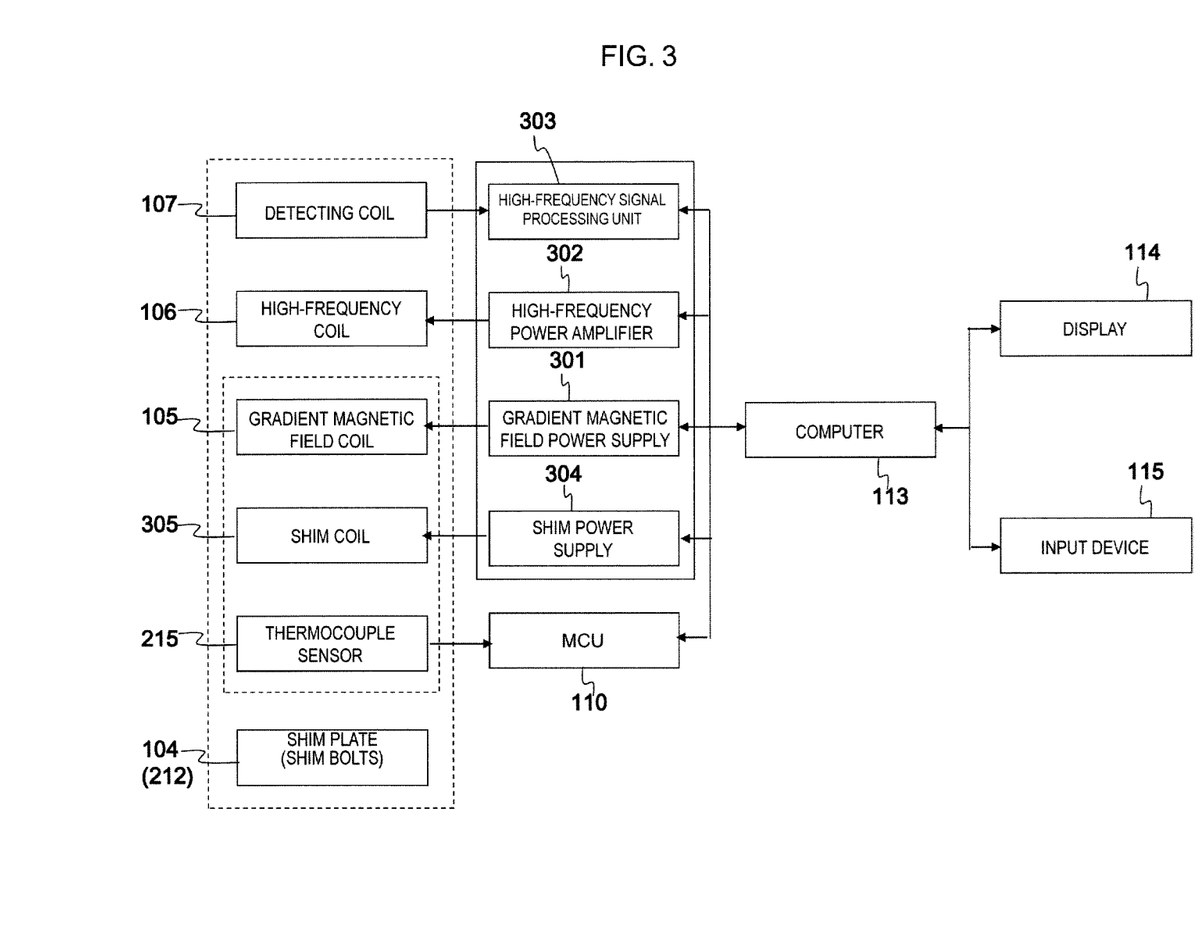
[FIG. 3] A block diagram showing a system configuration of the MRI apparatus of FIG. 1.

First, an configuration of an open-type MRI apparatus in accordance with a first embodiment is described with reference to FIGS. 1, 2 and 3. FIG. 1 is an entire configuration diagram of the open-type MRI apparatus. FIG. 2 is a cross-sectional view of a superconducting magnet 101. FIG. 3 is a block diagram of the MRI apparatus.

As shown in FIG. 1, the open-type MRI apparatus includes the superconducting magnet 101 disposed in a shielded test room 109. The superconducting magnet 101 generates a static magnetic field with a desired static magnetic field intensity in an imaging space 103 in which a subject 102 is placed. As shown in FIGS. 1 and 2, the superconducting magnet 101 includes magnetomotive force sources (cryostats) 101a, 101b disposed opposite at the top and bottom sides of the imaging space 103. A concave 210 is provided in the surface on the imaging space 103 side of the top and bottom cryostats 101a, 101b. In the internal space of the concave 210, a high-frequency coil 106, a gradient magnetic field coil 105 and a shim plate 104 are disposed in this order from the imaging space 103 side. This arrangement of the high-frequency coil 106, the gradient magnetic field coil 105 and the shim plate 104 in the concave 210 of the top and bottom cryostats 101a, 101b intends to widen the imaging space 103.

The shim plate 104 is firmly fastened to the cryostats 101a, 101b. The shim plate 104 is a plate-like member having holes spaced at a predetermined interval thorough which shim bolts 212 made of a magnetic material (e.g., iron) can be mounted. For example, the shim plate 104 may be an aluminum plate with a thickness of 1 cm and M10 (ISO standard) tapped holes spaced at a grid interval of about 1 cm. In this case, when an M10 screw made of iron as the shim bolt 212 is screwed through a desired tapped hole of the shim plate 104, the magnetic field generated by the shim bolt 212 (shim amount) can correct the static magnetic field distribution of the imaging space 103. This correction controls the homogeneity of the static magnetic field generated in the imaging space 103 by the superconducting magnet 101 to be less than or equal to 3 ppm. The reason for "3 ppm" is to maintain the static magnetic field inhomogeneity to be at least less than or equal to a chemical shift value because the chemical shift, or the difference of nuclear magnetic resonance frequency between the hydrogen atom of water molecule used to obtain a water/fat separated image and the hydrogen atom included in the methyl group of fat tissue is 3 ppm.

The gradient magnetic field coil 105 is fastened to the cryostats 101a, 101b by bolts 214 separated by a predetermined distance (e.g., 5 mm) from the shim plate 104. The gradient magnetic field coil 105 is a flat plate-like coil in which a coil is laminated and sealed with epoxy resin, the laminated coil generating a magnetic flux to give a gradient to the intensity of the magnetic flux density of the static magnetic field with respect to three directions perpendicular to one another, or X-, Y- and Z-axis directions of the imaging space 103. In order to minimize magnetic flux leakage to the shim plate 104 side, the gradient magnetic field coil 105 is shielded. A pulse-like current is caused to flow through the gradient magnetic field coil 105 according to the timing and intensity specified by an imaging pulse sequence to give a pulse-like magnetic field gradient to each axis in the imaging space 103. This associates the magnetic field intensity gradient with locations of areas to be tested of the subject 102, providing spatial information to an NMR signal.

Also, in the gradient magnetic field coil 105, a current shim coil 305 for correcting static magnetic field homogeneity (not shown in FIGS. 1 and 2) and a thermocouple sensor 215 for measuring temperature (not shown in FIGS. 1 and 2) are sealed with the epoxy resin together with the gradient magnetic field coil.

The high-frequency coil 106 is in the form of a flat plate-like coil so as not to spoil the openness of the structure of the superconducting magnet 101 and disposed so as to close the opening of the concave 210. The high-frequency coil 106 generates a high-frequency magnetic field necessary to excite nuclear magnetic resonance in a hydrogen nuclear spin included in a tissue to be tested of the subject 102. For example, in this case, a 50 MHz high-frequency magnetic field is set to be generated which causes a nuclear magnetic resonance at a hydrogen nucleus at a static magnetic field intensity of 1.2 T.

In this way, all of the shim plate 104, the gradient magnetic field coil 105 and the high-frequency coil 106 are included in the concave space 210, which facilitates the effective use of magnetic flux generated by superconducting coils 204 and the compact design of the superconducting magnet 101. Also, the gradient magnetic field coil 105 and the like do not narrow the imaging space 103, which facilitates the full use of the open structure of the superconducting magnet 101. Also, the high-frequency coil 106 is disposed so as to close the opening of the concave 210, which effectively suppresses the noise propagation in the imaging space 103 due to vibration of the gradient magnetic field coil 105.

A detecting coil 107 for detecting an NMR signal is disposed at the test position of the subject 102. As shown in FIG. 1, a patient table 108 is provided in front of the superconducting magnet 101. The patient table 108 carries the subject 102 so as to position the area to be tested to the center of the imaging space 103.

The superconducting magnet 101, the gradient magnetic field coil 105, the high-frequency coil 106, the detecting coil 107 and the patient table 108 are located in the shielded test room 109 that is electromagnetically shielded. This prevents an extraneous electromagnetic wave from entering the detecting coil 107 as noise.

As shown in FIG. 1, a magnet control unit 110 for monitoring the operational status of the superconducting magnet 101, and a filter circuit 111 are mounted in the wall of the shielded test room 109. The magnet control unit 110 receives outputs from various sensors attached to the thermocouple sensor 215 in the gradient magnetic field coil 105 and the superconducting magnet 101. A circuit cabinet 112 and a computer 113 are provided outside the shielded test room 109. As shown in FIG. 3, the circuit cabinet 112 includes a shim power supply 304 for supplying current to the shim coil 305, a gradient magnetic field power supply 301 for driving the gradient magnetic field coil 105, a high-frequency power amplifier 302 for applying high-frequency current to the high-frequency coil 106 and a high-frequency signal processing unit 303 for amplifying an NMR signal detected by the detecting coil 107. The computer 113 converts the NMR signal into an image for diagnostics, and monitors and controls the operational status of the MRI apparatus. A display 114 for displaying an image and an input device 115 for receiving operator input are connected to the computer 113. The filter circuit 111 connects the equipment including the coil in the shielded test room 109 and the circuit cabinet 112 and computer 113 outside the shielded test room 109 while removing noise components.

Next, the structure of the top and bottom cryostats 101a, 101b of the superconducting magnet 101 is further described with reference to FIG. 2.

As shown in FIG. 2, the top cryostat 101a includes a top helium container 203 for storing liquid helium and multiple superconducting coils 204 disposed in the top helium container 203. Similarly, the bottom cryostat 101b includes a bottom helium container 205 for storing liquid helium and multiple superconducting coils 204 disposed in the bottom helium container 205. The top helium container 203 and the bottom helium container 205 are connected by connecting pipes 206 also functioning as supporting rods. The outside of the top and bottom helium containers 203, 205 and the outermost portion of the connecting pipes 206 are covered with a sufficiently rigid vacuum chamber 207. For example, the vacuum chamber 207 may be made of stainless steel with a thickness of 15 mm. Thermal shield plates for blocking heat from the outside are disposed in the space between the vacuum chamber 207 and the top and bottom helium containers 203, 205 and in the space between the vacuum chamber 207 and the connecting pipes 206. In the connecting pipes 206, superconducting lead wires for connecting the superconducting coils 204 and various sensor circuits (not shown in FIGS. 1 and 2) are disposed.

The superconducting coils 204 generate a static magnetic field having a magnetic flux in the direction 209 from the top cryostat 101a to the bottom cryostat 101b. For example, in the imaging space 103 with a diameter of 40 cm, a static magnetic field with a magnetic field intensity of 1.2 T and a static magnetic field homogeneity within 3 ppm can be generated. Also, the multiple superconducting coils 204 are used in combination to reduce the magnetic field leakage and improve the static magnetic field homogeneity. Specifically, a current is applied so that the direction of the magnetic flux generated by the outermost portion of the superconducting coils 204 will be in the inverse of the direction of the magnetic flux generated by the innermost portion of the superconducting coils 204, which cancels the magnetic field intensities distributed around.

Also, in order to make the use of the magnetomotive force of the superconducting coils 204 as efficient as possible, the cryostats can be configured so that the superconducting coils 204 will be as close as possible to the imaging space 103. In this embodiment, the concave space 210 is provided in the inside diameter portion of the superconducting coils 204 to widen the imaging space 103.

As shown in FIG. 2, a cryocooler 211 is mounted on the top cryostat 101a. The cryocooler 211 recondenses vaporized helium gas in the top helium container 203. The recondensed helium liquid is supplied from the top helium container 203 to the bottom helium container 205 through the connecting pipes 206. This arrangement of the connecting pipes 206 and the cryocooler 211 allows the superconducting magnet 101 to recondense vaporized helium gas to use as refrigerant despite the open structure divided into the top cryostat 101a and the bottom cryostat 101b. This allows the open-structured superconducting magnet 101 to provide a closed-type cryostat like one-cryostat superconducting magnet does.

Figure 4:
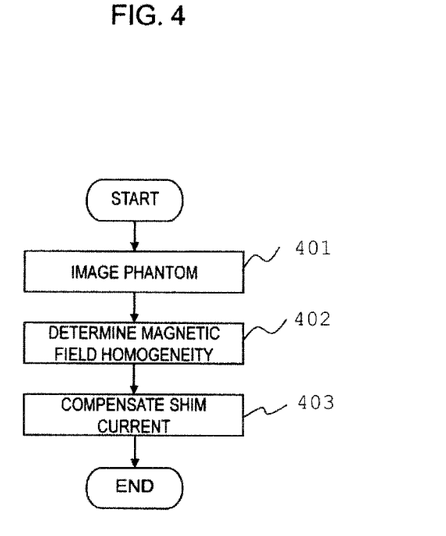
[FIG. 4] A flowchart showing the steps for adjusting the static magnetic field homogeneity of the MRI apparatus of FIG. 1.

A method for adjusting the static magnetic field homogeneity in the configuration of the open-type MRI apparatus shown in FIGS. 1 and 2 is described with reference to FIG. 4. In general, this adjustment is performed at a prescribed room temperature (e.g., 20° C.) so as to minimize the static magnetic field inhomogeneity at this temperature.

First, a phantom is imaged to measure a current static magnetic field inhomogeneity (step 401). An operator positions a uniform phantom (standard sample) at the center of the imaging space 103. Then, the computer 113 initiates the gradient magnetic field power supply 301 and the high-frequency power amplifier 302 according to an imaging pulse sequence that is a prescribed timing chart. A gradient magnetic field output from the gradient magnetic field coil 105 and a high-frequency magnetic field output from the high-frequency coil 106 are applied to the phantom in a static magnetic field. This causes an NMR in a hydrogen nucleus at a certain portion of the phantom and the hydrogen nucleus generates an NMR signal. The detecting coil 107 detects the NMR signal.

The received signal is subjected to amplification and detection processing and then converted to a digital signal in the high-frequency signal processing unit 303.

The computer 113 receives this signal, performs image reconstruction processing on the signal, and determines an inhomogeneity component of the static magnetic field from phase information (phase amount) of the reconstructed pixels. The NMR signal from the phantom that is uniform substance is phase-modulated only by the inhomogeneity component of the gradient magnetic field and the static magnetic field. The computer 113 can remove from the phase amount the phase amount due to the gradient magnetic field of which application intensity is recognizable to extract the phase amount only due to the inhomogeneity component of the static magnetic field, and accurately determine the inhomogeneity component of the static magnetic field from the extracted phase amount (step 402).

Next, an arrangement of the shim bolts 212 is determined so as to compensate the determined inhomogeneity component. The x-, y- and z-components can also be corrected by adjusting the amount of current from the gradient magnetic field power supply 301. Also, the inhomogeneity component is compensated by controlling the shim power supply 304 to supply an appropriate current to the shim coil 305 (step 403). The value of the magnetic field inhomogeneity remaining after the adjustment is stored in a memory of the computer 113 to be used in the imaging operation described later with reference to FIG. 5. At this point, the open-type MRI apparatus is ready to perform imaging on the subject 102.

Next, the operation of the computer 113 when the MRI apparatus of the embodiment performs imaging is described with reference to FIG. 5.

The operator operates the patient table 108 to position the subject 102 in the imaging space 103 (step 501). Then, the computer 113 receives an imaging parameter setting input to the input device 115 by the operator (step 502).

The computer 113 captures, through the magnet control unit 110, the output of the thermocouple sensor 215 integrated into the gradient magnetic field coil 105 to measure the temperature of the gradient magnetic field coil 105 (step 503). At this time, the magnet control unit 110 operates to convert the output signal of the thermocouple sensor 215 into an electrical signal that can be processed by the computer 113.

Next, the computer 113 determines whether or not the measured temperature of the gradient magnetic field coil 105 is lower than or equal to a predetermined allowable temperature of the gradient magnetic field coil 105 (step 504). The allowable temperature of the gradient magnetic field coil 105 is predetermined to be several or a dozen degrees or so lower than the heatproof temperature of the resin sealing the gradient magnetic field coil 105 in order to prevent the sealing resin from being damaged by the heat generated from the gradient magnetic field coil 105. If the measured temperature of the gradient magnetic field coil 105 has exceeded the allowable temperature, the display 114 notifies the operator that imaging is suspended until the gradient magnetic field coil 105 is cooled down, and the computer 113 returns to step 503. This prevents the temperature of the gradient magnetic field coil 105 from exceeding the heatproof temperature of the resin.

On the other hand, if the temperature of the gradient magnetic field coil 105 is lower than or equal to the allowable temperature in step 504, the temperature of the shim bolts 212 are determined from the temperature of the gradient magnetic field coil 105, based on which a current static magnetic field inhomogeneity is determined (step 506). The reason for determining the static magnetic field inhomogeneity from the temperature of the shim bolts 212 is that a slight change in the temperature of the shim bolts 212 causes the magnetic permeability to change, in turn causing the static magnetic field inhomogeneity to change, as described later.

Figure 5:
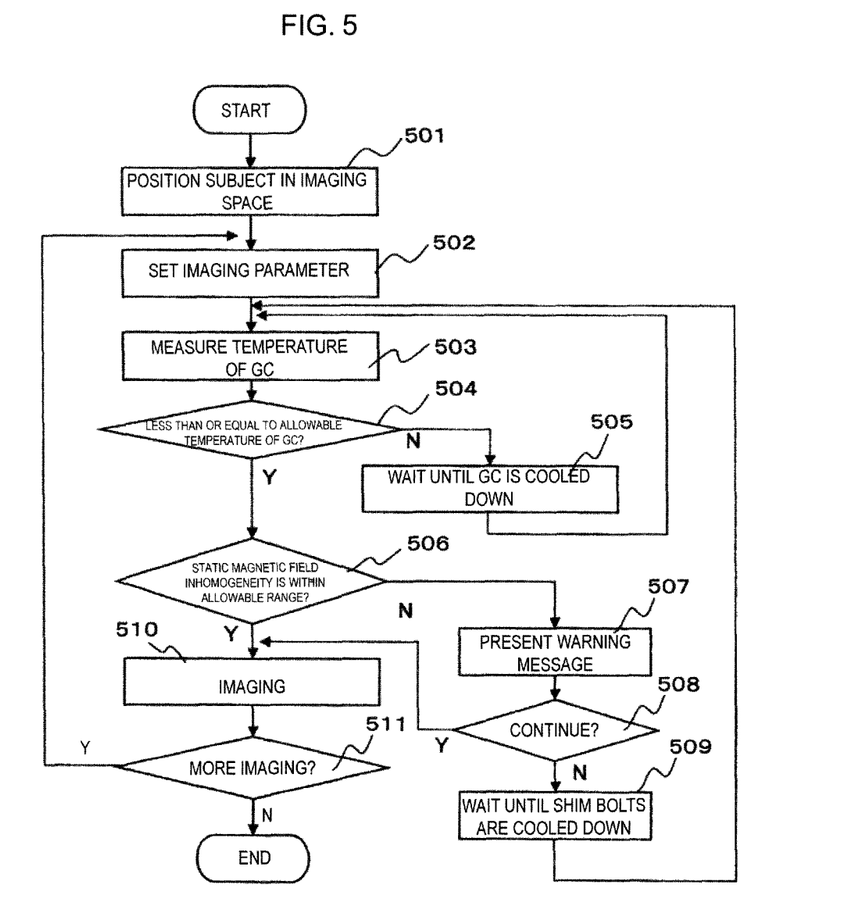
[FIG. 5] A flowchart showing the operation of the MRI apparatus of the first embodiment of the invention.
Figure 6:
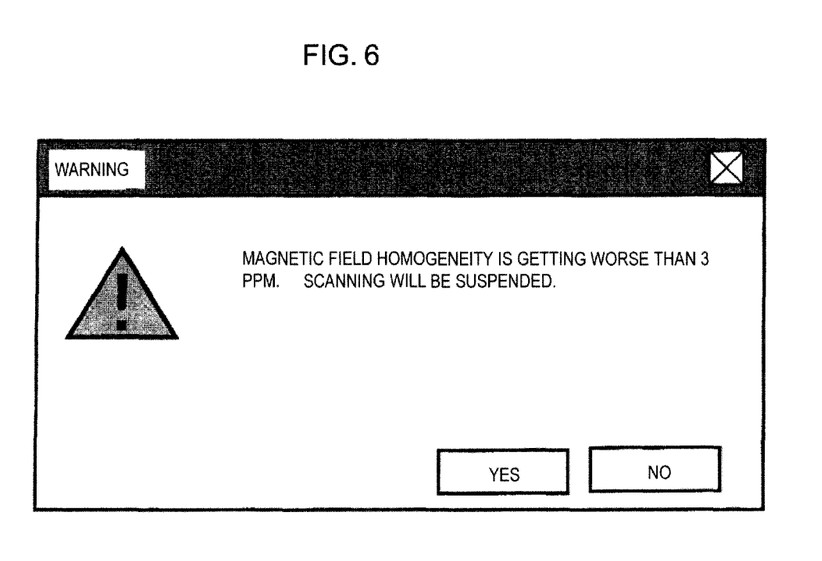
[FIG. 6] An example of warning message presented on a display for presenting the warning message in the operation of FIG. 5.

If the determined static magnetic field inhomogeneity has exceeded a predetermined allowable value (e.g., 3 ppm), the computer 113 proceeds to step 507 in which the display 114 presents a warning message notifying the operator accordingly, as an example shown in FIG. 6. In general, imaging requires a highly accurate static magnetic field homogeneity, such as when imaging a water/fat separated image. So, the operator may decide to suspend imaging. When the computer 113 receives an instruction to suspend imaging from the operator via the input device 115, the computer 113 waits a predetermined time until the shim bolts 212 are cooled down and returns to step 503 (steps 508, 509). Thus, the operator can wait until the shim bolts 212 are cooled down to the predetermined static magnetic field homogeneity and then perform imaging.

On the other hand, if imaging does not require the highly accurate static magnetic field homogeneity, the operator can decide to continue imaging in step 508. When the computer 113 receives an instruction to continue imaging from the operator via the input device 115, the computer 113 executes the imaging pulse sequence to perform imaging (step 510). For example, continuing imaging is desired when the test should be urgently performed or when the test does not require a precise fat suppression image. The control of the gradient magnetic field coil 105 in steps 504, 505 needs to be performed so as not to damage the gradient magnetic field coil 105. So, the operator is given no option to ignore the warning message, and, when the allowance value has been exceeded, imaging cannot be performed until the gradient magnetic field coil 105 is cooled down. On the other hand, in steps 506, 507 and 508, it is determined whether or not a change in the magnetic field homogeneity is within an allowable range for obtaining a high-quality MRI image. So, the operator can be given an option to perform imaging depending on the purpose of test even if the warning message is presented.

Now, the relation between the change in the temperature of the shim bolts 212 and the magnetic field homogeneity of the superconducting magnet 101 is described with reference to FIG. 7.

Figure 7:
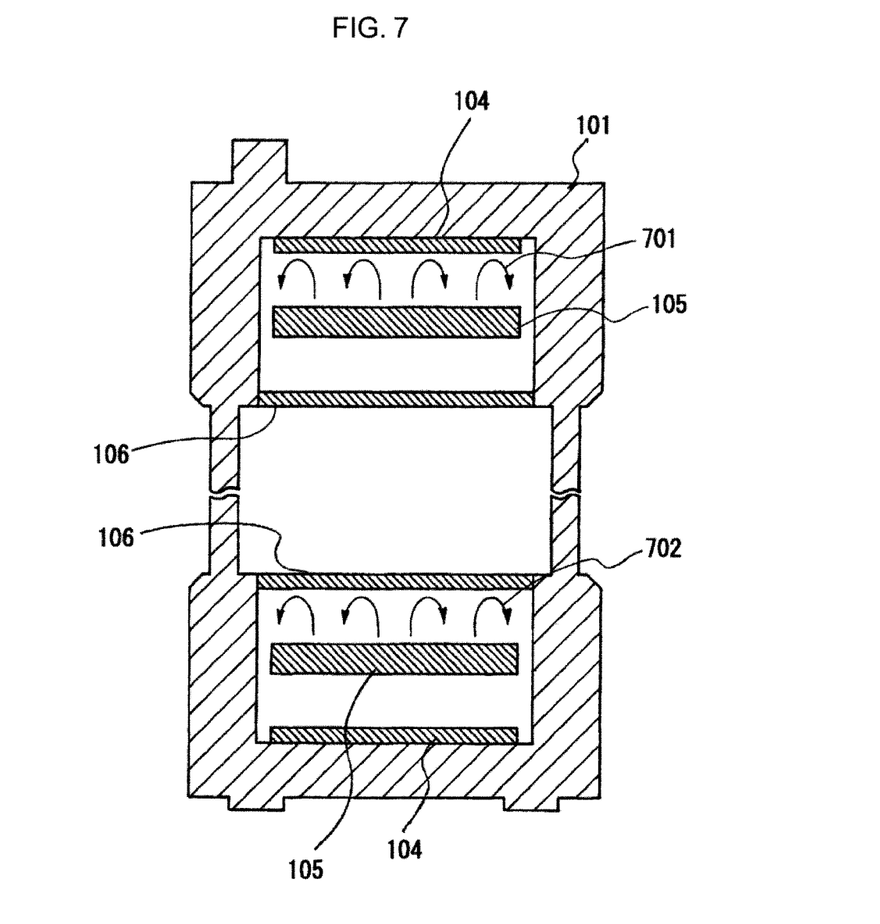
[FIG. 7] An illustration showing that the temperature of the shim plate increases due to heat generated from the gradient magnetic field coil 105 in the MRI apparatus of FIG. 1.

As shown in FIG. 7, the shim plate 104 and gradient magnetic field coil 105 mounted in the top cryostat 101a and the shim plate 104 and gradient magnetic field coil 105 mounted in the bottom cryostat 101b are disposed in order along the vertical axis. In imaging the subject 102, when a current (i) is applied from the gradient magnetic field power supply 301 to the gradient magnetic field coil 105 according to the imaging pulse sequence, the resistance component (r) of the gradient magnetic field coil 105 consumes the power ($r \times i^2$) that becomes heat to increase the temperature of the gradient magnetic field coil 105. The heat from the gradient magnetic field coil 105 mounted in the top cryostat 101a causes a convection 701 in the gap with the shim plate 104, and heat exchange occurs between the gradient magnetic field coil 105 and the shim plate 104.

The heat from the gradient magnetic field coil 105 mounted in the bottom cryostat 101b causes a convection 702 in the gap with the high-frequency coil 106, and heat exchange occurs between the gradient magnetic field coil 105 and the high-frequency coil 106. Accordingly, the shim plate 104 mounted in the top cryostat 101a is heated by the convection and the radiation heat from the gradient magnetic field coil 105. The shim plate 104 mounted in the bottom cryostat 101b is heated only by the radiation heat from the gradient magnetic field coil 105.

Further, the shim bolts 212 of the top and bottom shim plates 104 are also heated by a local eddy current due to an alternating magnetic field generated by the gradient magnetic field coil 105. As a result, the shim bolts 212 mounted in the top and bottom shim plates 104 are heated. Also, the temperature of the top cryostat 101a becomes higher than that of the bottom cryostat 101b, causing a temperature difference between the top and bottom shim plates 104.

The amount of change in the magnetic permeability of an iron of the shim bolts 212 mounted in the shim plate 104 with respect to temperature is as large as 4000 ppm/° C. So, even if the temperature of the gradient magnetic field coil 105 has not reached the allowable temperature, when the shim bolts 212 are slightly heated by the gradient magnetic field coil 105, the static magnetic field homogeneity changes. Further, the temperature difference between the top and bottom shim plates also causes the static magnetic field homogeneity to change.

Thus, in this embodiment, the temperature of the shim bolts 212 is measured and the change in the static magnetic field inhomogeneity is kept track of. In this case, of course, it is possible to mount a temperature sensor to directly measure the temperature of each of the shim bolts 212. However, the each of the shim bolts 212 is small, and the multiple shim bolts 212 are disposed, and also a spatial temperature distribution occurs among the multiple shim bolts 212, which requires many measuring points in order to directly measure the temperature of the shim bolts 212. In view of this, the temperature of a magnetic material of the shim is indirectly measured from the temperature of the gradient magnetic field coil 105.

Specifically, in the above-described step 506, the temperature of the shim bolts 212 is indirectly measured based on the temperature of the gradient magnetic field coil 105 to determine the change in the static magnetic field homogeneity. More specifically, first, the change in the temperature of the shim bolts 212 caused by the change in the temperature of the gradient magnetic field coil 105 is experimentally determined in advance. Then, the change in each component (inhomogeneity) of the static magnetic field due to the change in the temperature of the shim bolts 212 is measured in advance. From these results, the relation between the temperature of the gradient magnetic field coil 105 and the magnetic field inhomogeneity is determined as a curve shown in FIG. 8, for example, and stored in the memory of the computer 113. This allows the static magnetic field inhomogeneity to be determined from the temperature of the gradient magnetic field coil 105 measured in step 503.

Figure 8:
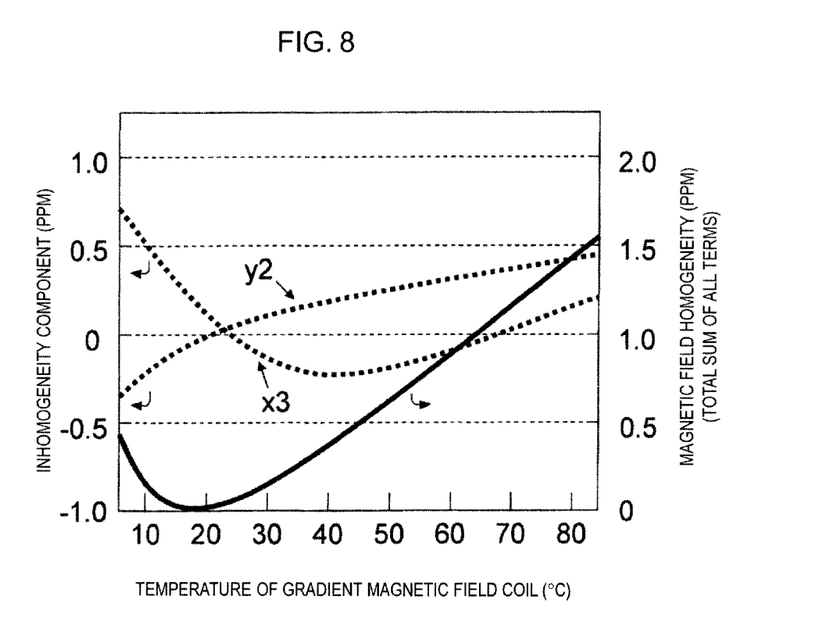
[FIG. 8] A curve showing the correlation between the temperature of the gradient magnetic field coil and the magnetic field homogeneity in the first embodiment of the invention.

The curve shown in FIG. 8 is described. The horizontal axis indicates the temperature of the gradient magnetic field coil 105. In FIG. 8, the measurement is performed with respect to the temperature of the gradient magnetic field coil 105 ranging from 10 to 80° C. The left-hand vertical axis indicates the magnetic field inhomogeneity of the static magnetic field inhomogeneity components in ppm. FIG. 8 shows two representative component x3 (third term component of x) and y2 (second term component of y) of the inhomogeneity components. The x3 (third term component of x) indicates that: when the temperature of the shim bolts 212 is low (the temperature of the gradient magnetic field coil is 10° C.), an inhomogeneity component of about 0.7 ppm is generated; the inhomogeneity component decreases as the temperature increases; when the temperature exceeds 20° C., the polarity of the inhomogeneity component turns into negative; and when the temperature is around 65° C., the polarity turns into positive again. On the other hand, the y2 (second term component of y) indicates that the inhomogeneity component changes monotonously from a negative error at low temperatures to a positive error at high temperatures.

FIG. 8 shows only the two components for simplification. However, the inhomogeneity components include a dozen or so terms affecting an MRI image in addition to those shown in FIG. 8, such as first terms of x, y and z. In practice, all of them are measured. The total sum of all the inhomogeneity components (static magnetic field inhomogeneity) needs to be determined in advance, as shown by the solid curve in FIG. 8. The right-hand vertical axis indicates the value of total sum of the inhomogeneity components (static magnetic field inhomogeneity) with a scale calibrated from 0 to 2 ppm. Since the above-described shim bolts 212 are adjusted so as to minimize the inhomogeneity at a prescribed room temperature (e.g., 20° C.), if the temperature of the gradient magnetic field coil is the same as the room temperature (20° C.), the homogeneity does not decrease, indicating 0 ppm. As the difference from 20° C. increases, the inhomogeneity increases to 1.5 ppm at 80° C.

Accordingly, for example, with the static magnetic field inhomogeneity adjusted to 1.8 ppm at 20° C., when the temperature of the gradient magnetic field coil reaches 70° C., the magnetic field inhomogeneity due to temperature change reaches 1.2 ppm, which causes the static magnetic field inhomogeneity at this point to exceed 3 ppm (=1.8 ppm+1.2 ppm). Also, as seen, the changes in the third term of x and the second term of y at this point are +0.1 ppm and +0.4 ppm, respectively.

Then, the solid curve shown in FIG. 8 or a formula derived from the solid curve is stored in the memory of the computer 113. By applying the stored curve or formula to a temperature of the gradient magnetic field coil 105 measured in step 503, the magnetic field inhomogeneity due to temperature change at that temperature can be determined. By adding this to the determined magnetic field inhomogeneity at the time of adjusting the static magnetic field, whether the allowable value has been exceeded or not can be determined in step 506. If exceeded, an appropriate warning message can be presented in step 507.

Note that, in the above embodiment, when the static magnetic field inhomogeneity has exceeded the allowable value, the operator decides whether imaging will be continued or suspended in step 508. However, a configuration in which the computer 113 automatically makes that decision is also possible. For example, in one possible configuration, the computer 113 determines from an imaging parameter set in step 502 whether or not imaging requires a highly accurate static magnetic field inhomogeneity (such as when imaging a water/fat separated image), and, if yes, decides to suspend imaging.

Note that the curve shown in FIG. 8 only needs to show the relation between the change in the static magnetic field homogeneity of the entire superconducting magnet 101 and the temperature of the shim plate directly or indirectly measured. Accordingly, although, in the first embodiment above, the temperature of the gradient magnetic field coil 105 is measured, it is, of course, possible to measure the temperature of or around the shim plate, determine the relation between the temperature and the static magnetic field homogeneity, and obtain a curve similar to FIG. 8 to use in step 506 in FIG. 5. Also, for the temperature of the gradient magnetic field coil 105, the temperature of both or either of the top and bottom gradient magnetic field coils 105 may be measured. For example, the temperature of only the top gradient magnetic field coil 105 that becomes higher may be measured.

Also, in the first embodiment above, a method other than using the thermocouple sensor 215 can be used to measure the temperature of the gradient magnetic field coil. For example, the temperature of the cooling water drained from a water-cooling pipe mounted in the gradient magnetic field coil 105 can be measured to determine the change in the static magnetic field inhomogeneity correlated with the temperature of the gradient magnetic field coil. The cooling water temperature is correlated with the temperature of the gradient magnetic field coil 105. As seen from FIG. 8, the temperature range of the gradient magnetic field coil 105 affecting the static magnetic field homogeneity is lower than the temperature of boiling water (100° C.). So, the static magnetic field inhomogeneity can be determined by measuring the cooling water temperature. In this method, in place of the curve shown in FIG. 8, a curve or formula showing the relation between the cooling water temperature and the static magnetic field inhomogeneity is experimentally determined in advance and used in step 506 in FIG. 5.

Second Embodiment

Next, an MRI apparatus in accordance with a second embodiment is described.

Figure 9:
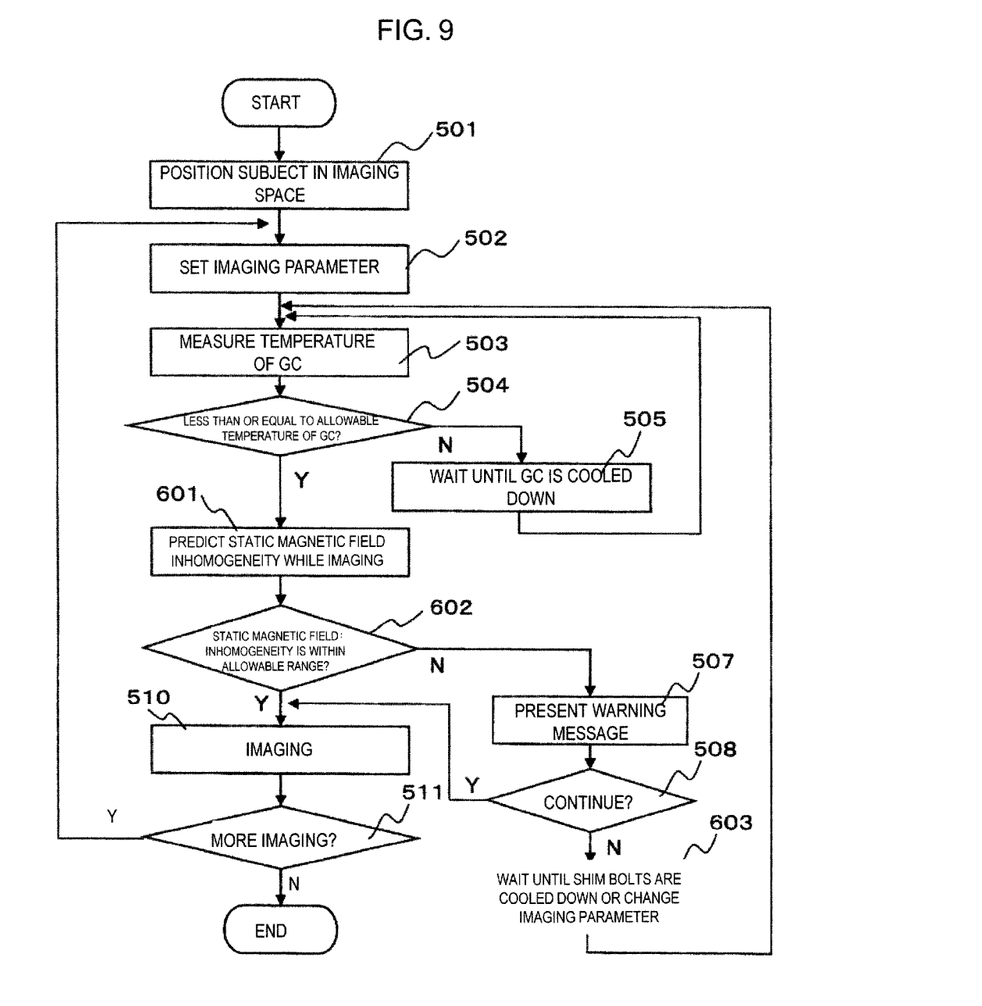
[FIG. 9] A flowchart showing the operation of the MRI apparatus of a second embodiment of the invention.

In this MRI apparatus of the second embodiment, according to the operation shown in FIG. 9, a static magnetic field inhomogeneity while imaging when imaging is performed is predicted, and whether the warning message will be presented or not is determined based on the predicted value rather than a current static magnetic field inhomogeneity. The reason for using the predicted value is that, when imaging is started, the temperature of the gradient magnetic field coil 105 increases, and, in turn, the temperature of the shim bolts 212 increases, causing the static magnetic field inhomogeneity to be larger than that before imaging is started.

Specifically, as shown in FIG. 9, the temperature (A) of the gradient magnetic field coil 105 is measured in step 503. Then, the increase (C) in the temperature of the gradient magnetic field coil 105 when the imaging pulse sequence is executed is determined. For example, in the memory of the computer 113, data of the increase in the temperature experimentally determined in advance for each combination of settable imaging parameters are stored. The computer 113 reads from the data in the memory the temperature corresponding to an imaging parameter set in step 502 to use as the temperature (C).

Next, the computer 113 calculates the temperature (A+C) to use as a predicted temperature of the gradient magnetic field coil 105 while imaging. By applying the curve shown in FIG. 8 in the first embodiment or the formula derived from the curve to this temperature (A+C), the static magnetic field inhomogeneity corresponding to the temperature (A+C) can be determined. By adding the determined change in the static magnetic field inhomogeneity to the magnetic field inhomogeneity in an initial condition (e.g., 20° C.), the static magnetic field inhomogeneity while imaging can be predicted (step 601).

The computer 113 uses the predicted static magnetic field inhomogeneity while imaging to determine whether or not the static magnetic field inhomogeneity has exceeded the allowable value, as with the first embodiment (step 602). If the predicted static magnetic field inhomogeneity is within the allowable value, imaging is performed according to the imaging pulse sequence (step 510). If the allowable value has been exceeded, the warning message is presented (step 507), and an instruction to or not to continue imaging is received from the operator (step 508). If imaging is suspended, the computer 113 can wait a predetermined time until the gradient magnetic field coil 105 is cooled down or receive a parameter change of the imaging pulse sequence from the operator (step 603). The reason for receiving the change of the imaging parameter is that changing the imaging parameter may allow the increase in temperature while imaging to be suppressed, allowing imaging to be continued without waiting until the gradient magnetic field coil 105 is cooled down.

Then, whether another imaging is needed or not is determined (step 511). If not, the computer 113 ends the process. If another imaging is needed, the computer 113 returns to step 502.

The remaining configuration and operation of the MRI apparatus of the second embodiment is similar to those of the apparatus of the first embodiment and is not specifically described here.

Since the MRI apparatus of the second embodiment can predict the magnetic field inhomogeneity while imaging and determine whether the predicted value is within the allowable value or not, the possibility that the magnetic field inhomogeneity may decrease as the temperature increases while imaging and a desired image may not be obtained can be excluded. This prevent imaging from ending in vain and can provide an image imaged with a high magnetic field homogeneity.

Third Embodiment

Next, an MRI apparatus in accordance with a third embodiment is described.

The MRI apparatus in accordance with the third embodiment predicts the static magnetic field inhomogeneity while imaging as with the MRI apparatus of the second embodiment, and, if the static magnetic field inhomogeneity can be compensated with a shim current, performs imaging after performing the compensation. If the static magnetic field inhomogeneity cannot be compensated with the shim current, a warning message is presented.

The operation of the MRI apparatus of the third embodiment is described below with reference to FIG. 10.

Figure 10:
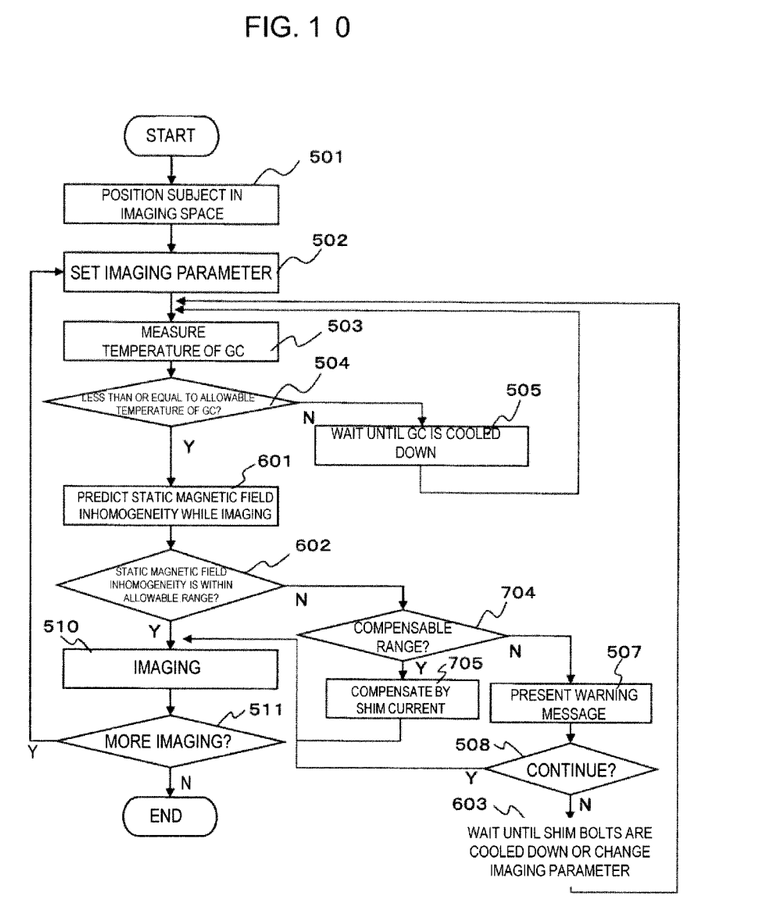
[FIG. 10] A flowchart showing the operation of the MRI apparatus of a third embodiment of the invention.

As shown in FIG. 10, after the subject 102 is positioned in the imaging space 103 by the operator (step 501), the computer 113 receives an imaging parameter setting (step 502) and captures the temperature of the gradient magnetic field coil 105 from the thermocouple sensor 215 (step 503). Then, the static magnetic field inhomogeneity while imaging when imaging is performed is predicted (step 601). Then, whether or not the static magnetic field inhomogeneity has exceeded the allowable value is determined using the predicted static magnetic field inhomogeneity while imaging (step 602). The operation described above is the same as that of the second embodiment.

In the third embodiment, if the static magnetic field inhomogeneity predicted in step 601 has exceeded the allowable value, it is determined whether or not the static magnetic field inhomogeneity is within the range in which it can be compensated by supplying a shim current to the shim coil 305 (step 704). Specifically, whether or not the static magnetic field inhomogeneity can be compensated is determined by comparing a magnetic component generated by a maximum shim current predetermined for each coil including the shim coil 305 and each component of the predicted static magnetic field inhomogeneity.

If the static magnetic field inhomogeneity can be compensated by the shim current, the computer 113, while executing the imaging pulse sequence, controls the shim power supply 304 to supply an appropriate shim current and performs imaging with the static magnetic field inhomogeneity compensated (steps 705, 510). Then, if another imaging is needed (step 511), the computer 113 returns to step 502.

On the other hand, if the predicted static magnetic field inhomogeneity is too large to compensate by the shim current, the display 114 presents a warning message notifying the operator accordingly (step 507). Then, the computer 113 receives an instruction to continue or suspend imaging from the operator (step 508). If imaging is suspended, the computer 113 waits a predetermined time until the gradient magnetic field coil 105 is cooled down so that the static magnetic field inhomogeneity can be compensated by the shim current, or receives a parameter change of the imaging pulse sequence from the operator (step 603). Then, the computer 113 returns to step 503.

The remaining configuration of the MRI apparatus of the third embodiment is similar to that of the apparatus of the first embodiment and is not specifically described here.

As described above, in the third embodiment, even when the predicted static magnetic field inhomogeneity has exceeded the allowable value, if the predicted inhomogeneity is within the range in which it can be compensated by the shim current, imaging can be performed while performing the compensation, which provides higher probability that imaging can be performed than that for the apparatus of the second embodiment.

Note that, in the first embodiment, if the static magnetic field inhomogeneity has exceeded the allowable value in step 506 in FIG. 5, the display 114 immediately presents the warning message in step 507. However, in the first embodiment, as in the third embodiment, if the static magnetic field inhomogeneity has exceeded the allowable value, it can also be determined, by performing step 704 in FIG. 10, whether or not the inhomogeneity can be compensated by the shim current. Then, if compensable, imaging can be performed by compensating by the shim current in step 705.

As has been described above, according to the invention, the MRI apparatus that provides an open and low-noise testing environment can keep track of decrease in the static magnetic field homogeneity due to temperature increase of the shim bolts and can always provide an image with a constant quality.

Note that, in the first to third embodiments above, the warning message in step 507 is not only presented on the display 114, but also can be transmitted to a remote service person who manages the MRI apparatus through a communication line or the like and presented on his/her remote display, or can be presented as a voice message.

In the above embodiments, the warning message notifies decrease in the static magnetic field inhomogeneity. In addition, the warning message may also show a value from the temperature sensor of the gradient magnetic field coil or a value of the static magnetic field inhomogeneity. Or the warning message may show these information at one time.

Also, in the above embodiments, the temperature of the gradient magnetic field coil 105 is measured (step 503) before starting imaging. The invention is not limited to this, but the configuration is also possible in which the output from the temperature sensor of the gradient magnetic field coil 105 is continuously captured by the computer 113 to determine the static magnetic field homogeneity and present the warning message.

The invention claimed is:
1. A magnetic resonance imaging apparatus, comprising:
  a pair of static magnetic field generators separately disposed at the top and bottom of an imaging space in which a subject is placed;
  a shim magnetic material, disposed on the imaging-space side of each of the pair of static magnetic field generators, configured for generating a magnetic field and thereby adjusting the static magnetic field;
  a gradient magnetic field generator;
  a high-frequency magnetic field generator;
  a temperature sensor configured for measuring the temperature of the gradient magnetic field generator in order to predict the temperature change of the shim magnetic material; and a controller configured for controlling the gradient magnetic field generator and the high-frequency magnetic field generator and for executing an imaging pulse sequence, wherein the controller determines the inhomogeneity of the static magnetic field from the output of the temperature sensor, considers the change in the magnetic field generated by the shim magnetic material due to the temperature change of the shim magnetic material, and causes a warning message to be presented when the controller determines that the determined static magnetic field inhomogeneity has exceeded a predetermined allowable value.

2. The magnetic resonance imaging apparatus according to claim 1, characterized in that the controller predicts based on the temperature of the gradient magnetic field generator measured by the temperature sensor, the temperature change of the shim magnetic material while imaging when the imaging pulse sequence is executed, and predicts from this predicted temperature change, the static magnetic field inhomogeneity that is present while imaging.

3. The magnetic resonance imaging apparatus according to claim 1, characterized in that the controller determines the static magnetic field inhomogeneity at the point when the temperature sensor measures the temperature of the gradient magnetic field generator.

4. The magnetic resonance imaging apparatus according to claim 1, further comprising a shim coil configured for generating a magnetic field and thereby adjusting the static magnetic field, wherein when the static magnetic field inhomogeneity has exceeded a predetermined allowable value, the controller determines whether or not the static magnetic field inhomogeneity is capable of being compensated for by supplying a shim current to the shim coil, and when the static magnetic field inhomogeneity is not within a compensable range, the controller causes the warning message to be presented on a display device.

5. The magnetic resonance imaging apparatus according to claim 1, characterized in that, after causing the warning message to be presented on a display device, the controller receives an instruction from an operator to perform, or an instruction to suspend, imaging.

6. The magnetic resonance imaging apparatus according to claim 5, characterized in that, after causing the warning message to be presented on a display device, the controller receives an imaging parameter change of the imaging pulse sequence from the operator.

7. The magnetic resonance imaging apparatus according to claim 5, wherein when the controller has received, from the operator, the instruction to suspend imaging from the operator, the controller waits a predetermined time and, after waiting, causes the shim magnetic material to be cooled.

8. The magnetic resonance imaging apparatus according to claim 2, characterized in that the controller predicts the temperature change of the shim magnetic material while imaging, from the increase (determined in advance) in the temperature of the gradient magnetic field generator measured by the temperature sensor when the imaging pulse sequence is executed, and uses a relationship (determined in advance) between the temperature measured by the temperature sensor and the static magnetic field inhomogeneity in order to predict the static magnetic field inhomogeneity while imaging, that corresponds to the predicted temperature change of the shim magnetic material.

9. The magnetic resonance imaging apparatus according to claim 3, characterized in that the controller uses a relationship (determined in advance) between the temperature of the gradient magnetic field generator measured by the temperature sensor and the static magnetic field inhomogeneity in order to determine the static magnetic field inhomogeneity corresponding to the temperature of the gradient magnetic field generator measured by the temperature sensor.

10. The magnetic resonance imaging apparatus according to claim 1, wherein the static magnetic field inhomogeneity determined by the controller is attributable to the temperature change of the shim magnetic material.

11. A method for controlling a magnetic resonance imaging apparatus that includes static magnetic field generators disposed at the top and bottom of an imaging space in which a subject is placed, a shim magnetic material disposed on each of the static magnetic field generators in order to generate a magnetic field and thereby adjust the static magnetic field, a gradient magnetic field generator and a high-frequency magnetic field generator, the method comprising:

(a) measuring, by a temperature sensor, the temperature of the gradient magnetic field generator;

(b) determining an inhomogeneity of the static magnetic field from the output of the temperature sensor, based on a predetermined relationship between the inhomogeneity of the static magnetic field and the temperature of the gradient magnetic field generator; and (c) causing a warning message to be presented on a display device, when the determined static magnetic field inhomogeneity has exceeded a predetermined allowable value.

12. The method according to claim 11, wherein the static magnetic field inhomogeneity determined in (b) is attributable to a temperature change of the shim magnetic material.

* * * * *